(12) United States Patent
Minker

(10) Patent No.: US 6,377,184 B1
(45) Date of Patent: Apr. 23, 2002

(54) TRANSMISSION LINE SAFETY MONITORING SYSTEM

(76) Inventor: Gary A. Minker, 4271 122 Dr. North, Royal Palm Beach, FL (US) 33411

( * ) Notice: Subject to any disclaimer, the term of this patent is extended or adjusted under 35 U.S.C. 154(b) by 0 days.

(21) Appl. No.: 09/546,163

(22) Filed: Apr. 11, 2000

(51) Int. Cl.[7] ............................................. G08B 21/00
(52) U.S. Cl. ...................... 340/635; 340/551; 340/557; 340/825.69
(58) Field of Search ................................ 340/635, 551, 340/557, 825.69, 825.72

(56) References Cited

U.S. PATENT DOCUMENTS

| | | |
|---|---|---|
| 3,753,086 A | 8/1973 | Shoemaker |
| 4,021,731 A | 5/1977 | Alsberg |
| 5,107,447 A * | 4/1992 | Ozawa et al. .......... 363/551.01 |
| 5,146,170 A | 9/1992 | Ishkawa |
| 5,396,180 A * | 3/1995 | Hampton et al. ........... 324/551 |
| 5,600,248 A | 2/1997 | Westrom |
| 5,982,181 A | 11/1999 | Rokunohe |

* cited by examiner

Primary Examiner—Julie Lieu
(74) Attorney, Agent, or Firm—Malin, Haley & DiMaggio, P.A.

(57) ABSTRACT

A cost-effective transmission line safety monitoring system which detects and tracks acoustic and chemical anomalies along a transmission line to determine if a destructive event is present. One or more sensors, each enclosed in a weather-resistant container, are attached to an antenna and installed as part of the antenna transmitting system on a tower, building top or hill. The acoustic signatures and gas purity deviations are detected and transmitted to a remote master processing center where, via the use of packaged software, the signals are continuously compared to an existing library of acceptable and non-acceptable signatures for pattern matches. An operator, using a PC in a simple WINDOWS® format, may assign newly acquired signatures to the library for future operation. Different levels of alarms may be triggered and a system shutdown may be initiated, if the incoming signals are similar to or directly match one of the pre-entered non-acceptable signatures, or alternatively, if the gas purity levels are exceeded.

19 Claims, 2 Drawing Sheets

TRANSMISSION LINE SAFETY MONITORING SYSTEM

BACKGROUND OF THE INVENTION

1. Field of the Invention

The invention relates to radio and television transmission line systems, and particularly to a transmission line damage and detection system wherein one or more sensor nodes are introduced into a transmission line at specified intervals in order to detect acoustic or chemical anomalies, determine the severity of each anomaly and to assign various alarm levels to each anomaly occurrence based upon a comparison of each with a table of acceptable ultrasonic noise and gaseous chemical contamination readings.

2. Description of Related Art

In typical radio and television transmission systems, anomalies often occur in the system due to a variety of factors. These anomalies may be acoustic or chemical in nature and in both cases affect the transmitted signal. While voltage standing wave fault detection systems may be in use in the industry, they are generally highly inaccurate, error-prone systems that ignore all but the most serious fault conditions that more often than not fail to properly detect system anomalies or do so at a vary high repair cost to the system operator due to the level of sustained damage.

The present invention overcomes the shortcomings found in the prior art by providing a cost-effective transmission line safety monitoring system which detects and tracks acoustic and gaseous chemical anomalies along a transmission line to determine if a destructive event has occurred or is in mid-occurrence, by providing one or more sensors attached to an antenna and feed line transmission system. Analog audio signals are digitized and, along with detected gas purity deviations are transmitted to a remote master processing center where the signals are compared to an existing database of acceptable and non-acceptable signatures for pattern matches. The system operator may be informed, via visual or audio alarms, if any of the incoming signals are similar to or directly match one of the pre-entered non-acceptable signatures.

BRIEF SUMMARY OF THE INVENTION

The present invention provides a transmission line safety detection and physio/electrical damage prevention system which effectively identifies acoustic and chemical anomalies along a transmission system, determines their severity and compares them against a database of allowable anomaly signatures in order to determine if an alarm needs to be rendered.

In the preferred embodiment, one more detectors are placed either on an antenna, the transmission line feeder system or associated feed line system, on a tower or support structure, or in the transmitter building to "listen" to the electrical samples being generated by the sensor system. The detectors search for the acoustic signature of the audio signal. The detector searches for one of two types of anomalies which may be present within the transmission system.

The detectors digitize the audio signal and transmit this signal to a remote processing unit. The processing unit then proceeds to determine the apparent severity of each detected anomaly. The processing unit contains a means for decoding the audio signal and comparing the decoded audio signal to a database of permissible sounds. Based upon the comparison of the incoming audio signal to the database of permissible sounds, the processor determines if a destructive event is present in the transmission system.

Depending on the results of the comparison, one of a variety of alarm events may be triggered and the operator informed so that he can take corrective action. Should the event be deemed severe enough, the detection system will initiate a system shut down to prevent further damage.

Accordingly, it is an object of the present invention to detect and monitor acoustic and chemical anomalies which may be present along a transmission line, transmit the audio signals corresponding to these anomalies to a remote processing center, compare the transmitted signals to a library of permissible sounds, and to notify an operator of the severity of the anomaly should it be determined that the anomaly does not correspond to an allowable signal.

It is another object of the present invention to provide a monitoring system that includes software, supplied via a disk or a CD ROM, easily adaptable to a common P.C. type computing system.

It is yet another object of the present invention to provide the user with a cost efficient means of monitoring transmission systems via the use of a custom-made package of hardware and software components derived for each specific application.

In accordance with these and other objects which will become apparent hereinafter, the instant invention will now be described with particular reference to the accompanying drawings.

DETAILED DESCRIPTION OF THE INVENTION

Figure 1:
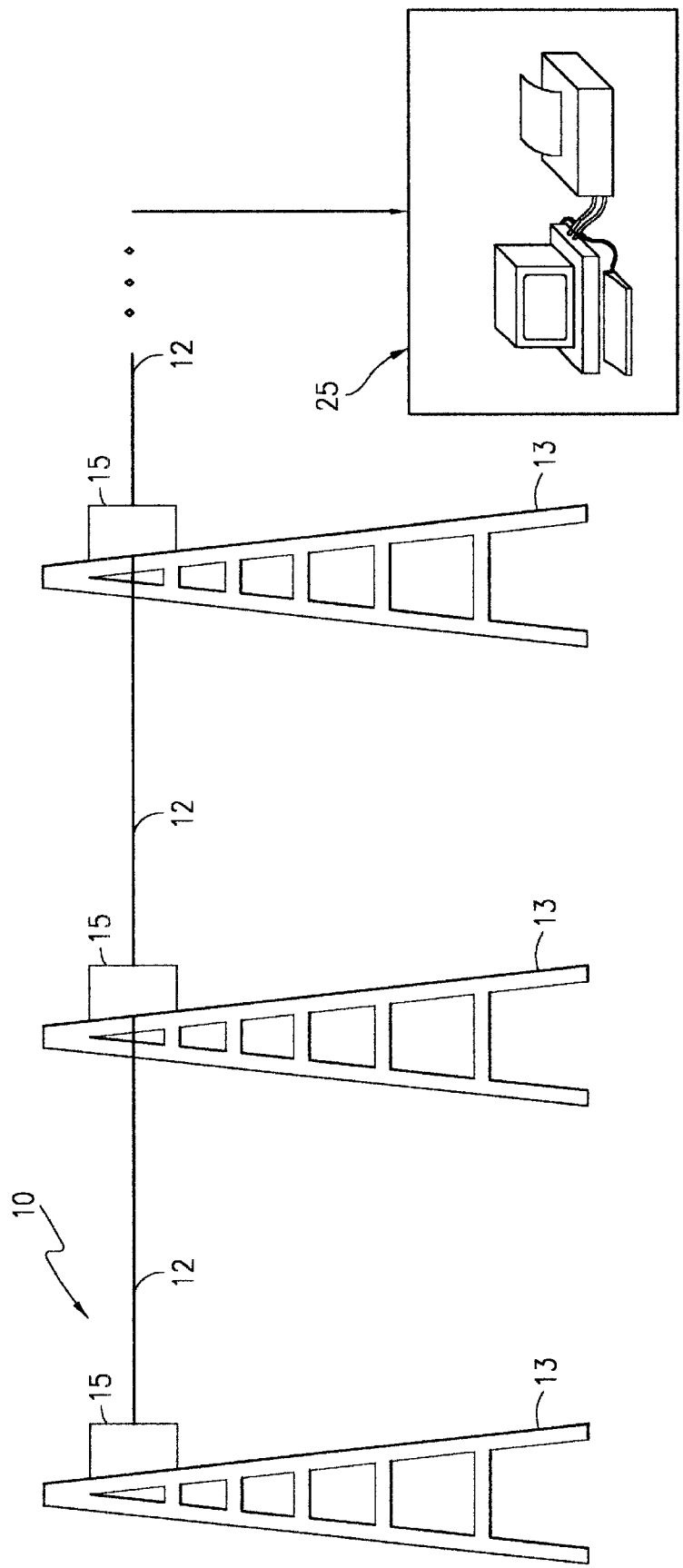
FIG. 1 shows a typical transmission line utilizing the present invention.

Turning now to the drawings, FIG. 1 illustrates the basic components of the preferred embodiment of the present invention 10 including one or more sensors 15 affixed upon an object such as an antenna 13 along a transmission system 12, a master processing unit 25 located at a remote site and connected to each of the sensors.

Sensors 15 are ultrasonic detectors strategically placed along transmission line 12. In high powered television applications utilizing air dielectric large diameter rigid coaxial systems or waveguide transmission lines, sensors 15 are introduced onto transmission line 12 approximately every 200 feet to 400 feet. Preferably, sensors 15 are placed every 200 feet. Sensors 15 are tuned to monitor the acoustic signatures of noises along the transmission system within an audio band between 20 KHz to 40 KHz.

Sensors 15 are inserted into gas block style frames. The frames are drilled to facilitate acoustic coupling of the detector to the line cavity area. Acoustic coupling must be bidirectionally linear. The acoustic signatures are collected via a precision electret style condenser microphone having a predictable acoustic response. The acoustic signatures are analog and are digitized at a high bit and sample rate. The digitized signal is then encoded with a number corresponding to the detector's location and transmitted via RS-232, high speed serial mode, twisted pair ether net or fiber optic cable, or a coaxial conductor, directly to master processing unit 25.

Each sensor 15 is comprised of a dual input system. Unit 1 of sensor 15 comprises an acoustic sensor. This device listens to the audio spectrum from the low frequency cutoff of the transducer of about 20 KHz. The continuous stream of analog audio is digitized, initially at approximately 16 bit resolution, and placed into an information packet which also includes other data.

The second component of each sensor 15, unit 2, is a gas product sensor. This sensor looks for products of combustion, acid vapors and/or monoxides. A more simple Nitrogen type system may also be utilized. The gas product sensor feeds a linear gas comparator. A linear quality word is then embedded into the information packet of data which is sent to processing unit 25.

The packet of data from each sensor location contains a two digit numeric or alpha identifier, the gas product quality word, and 50 millisecond audio packets. Each sensor 15 is field programmable and operates on 48 volts alternating current. The gas product quality word also contains the sensor I.D. number.

The sensor digitizing integrator and communication package is contained in a weather-resistant gasketed and hinged sealed container with weather-tight connectors. Each sensor insertion package is comprised of a specially milled gas barrier type flange to conform to the size of transmission line 12. The flanges are milled to accommodate the installation of the acoustic and gas product barrels. An insulator system and connecting bullet conductor is fitted into each sensor to promote passage of gases. Sensors 15 are easily installed into existing systems with the flange and bolts.

Figure 2:
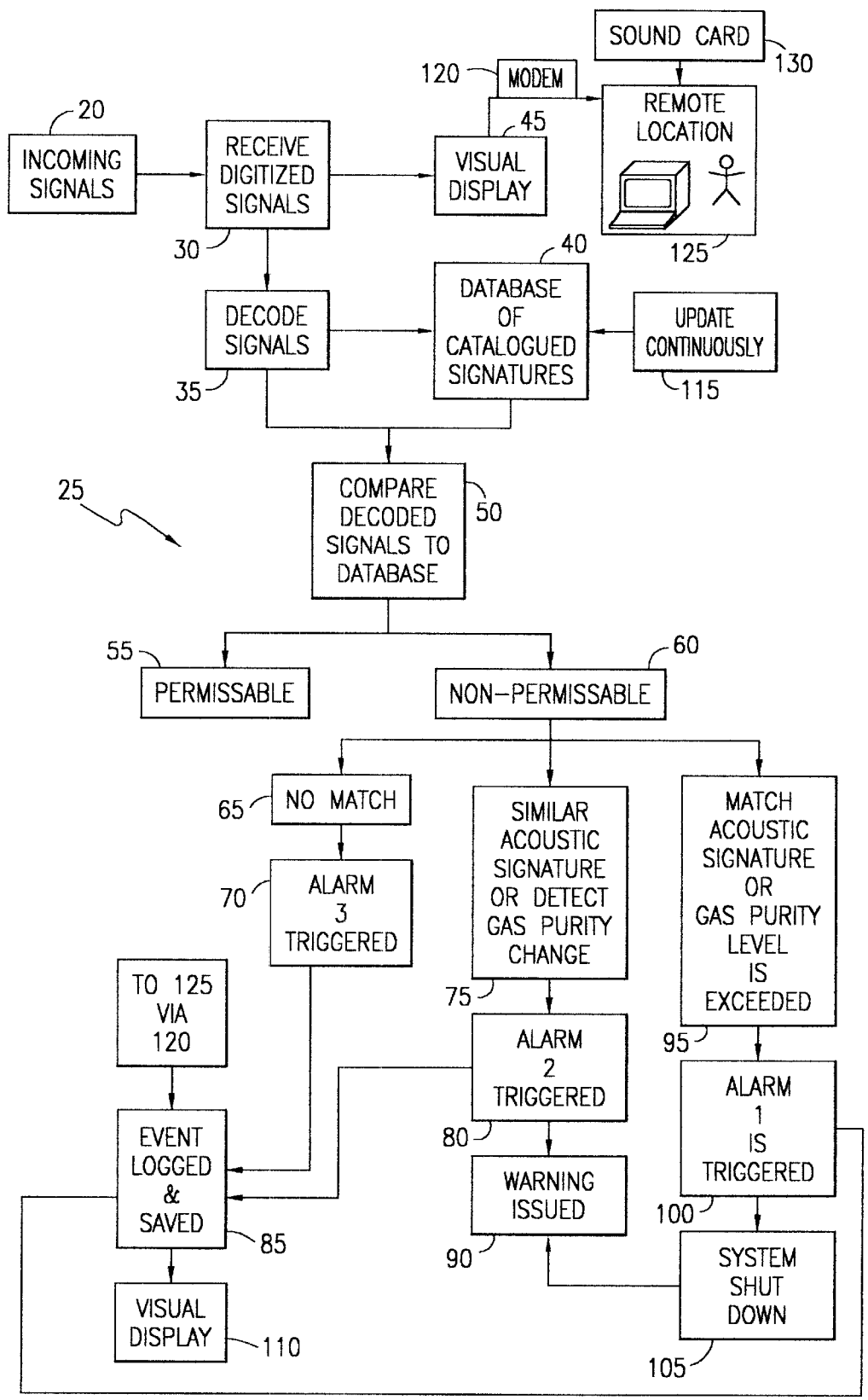
FIG. 2 shows a flowchart of the operation of the main processing unit of the present invention.

FIG. 2 shows a flowchart of the steps taken by processing unit 25. Master processing unit 25 is a comparator unit that decodes the high speed stream of digitized audio signals transmitted from each sensor 15 and analyzes the information in real time mode. Each incoming digitized signal 20 representing audio signatures is received 30, decoded 35 and compared 50 in a rolling time window to a database of catalogued sounds 40. Signals 30 may be displayed 45 on a computer screen. Database 40 contains a large number of ultrasonic byproduct events which are recorded and digitized. Permissible and non-permissible acoustic signatures are maintained.

Processing unit 25 compares the ultrasonic signatures of acceptable noises such as line scraping, mild impacts, spring resonance, and pressurizing gas orifice noise with those of the permissible sounds present within the processor's database 40.

The signatures classified as permissible 55 and non-permissible 60, are filed and catalogued. Types of signatures that would not be permitted are those attributable to arcing, single discharges, prolonged scraping contacts generating arcing, and corona discharge. Upon receipt of any recognized and non-permissible noise, processing unit 25 initiates an alarm condition.

Included in the alarm condition would be the detector location, a visual presentation of the acoustic signature, a comparison to the previously filed non-permissible signature, the relative percentage of match indication and the database file location of the noise signature number.

As an optional feature of the present invention, acoustic playback of translated signatures would be available. Certain noises will have the ability to give various levels if alarm indication is presented. Processor 25 is capable of outputting a long term memory record of alarm conditions.

Preferably, the processor categorizes all acoustic events into one of three groups. If the incoming acoustic signature does not match with any non-permissive pattern within the processor's library, shown by step 65, an alarm level three event is triggered 70, logged and saved 85 for analysis at a later time.

If an acoustic signal is similar to a non-permissive signature or a gas purity change has been detected 75, an alarm level two event is triggered 80 and logged 85 and a dial-out or warning signal is sent to the operator 90.

If an incoming acoustic signal has been definitely matched to a non-permissive signature or a gas purity level has been exceeded 95, an alarm one event is triggered 100 and logged 85, and is accompanied by programmable system shut down 105, and a dial-out or warning signal to the operator 90.

All combinations of functions are available in the alarm screen for maximum user integration and control. Events captured by the processor that are of no significant match are discarded after review by the control operator or system engineer.

The operator is presented with a visual display 110 of the recorded acoustic events from all three alarm levels in the alarm log. This visual display of the log 110 is provided to reference the captured event wave forms and the accompanying translated acoustic signatures. The operator has the ability to enter a new signature into the database to update the existing library, via step 115. The acoustic signature library is supplied to the user with a non-volatile set which may be modified. Admission, deletion and modification of the signature database may take place, via password protection, at the user's discretion.

Included in the information packet sent to the processor is gas purity sensing data which monitors the pressurized environment within the system. Changes in the quality and purity of the selected gas types, which can occur in sudden depressurization, fire or smoke, are continuously monitored and the quality is displayed as a graph by a computer. Any deviations in the quality of the environment are stored and assigned to the alarm list. Gas purity violations are automatically listed as an automatic alarm level two event which is designed to call for assistance and interpretation immediately upon discovery.

The software included in the present invention can be supported by a standard PC with a 486 processor, 4 Megs of RAM, a 1 Gig hard drive, VGA monitor, mouse, standard sound card with speakers, 2 com ports, printer and either a disk or CD ROM drive.

A modem 120 is preferred as it allows a user to communicate with the system PC from a remote location 125 or share or retrieve other signature data from master database 40 from the manufacturer of the system. The modem connection 120 allows for screen emulation at remote site 125. The entire windows screen environment may be accessed via modem connection 120 which provides a remote user the ability to download files, wave tables, waveforms and all active and set up screens.

Processing center 25 has sufficient memory to support unattended operation of alarm events for several thousand events. Output of the alarm events is compatible with standard remote control systems readily available in the industry. Modem interface of external or internal configuration is designed to mate with any standard Hayes compatible dial up auto answer or interrogation independently in a ring or forced carrier mode. The alarm mode is designed to provide a simple mechanical relay type closure for interface with most common types of remote control apparatuses in the industry today.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. An apparatus for detecting and monitoring system anomalies along a transmission line comprising:
   a plurality of detectors situated along a transmission line, said detectors to monitor acoustic signatures of audio signals along said transmission line;
   a processing unit disposed at a location remote from said detectors;
   means for transmitting said audio signal to said processing unit; and
   means for comparing said transmitted audio signals to a database of permissible and non-permissible sounds to determine if said audio signals qualify as a destructive event; and
   each said detector is comprised of an acoustic detector module which detects said analog signals, digitizes said signals, and transmits said signals via a data packet to said remote processing unit wherein said digitized signals are encoded with a number corresponding to the detector's location along said transmission line, and a gas product detector module for monitoring the pressurized environment within said transmission line which creates a linear quality word representing gas purity within said transmission line, said linear quality word is embedded into said data packet and transmitted to said remote processing unit, wherein said linear quality word representing gas purity within said transmission line contains a number corresponding to the detector's location along said transmission line.

2. The apparatus of claim 1 further including one or more alarm triggering means wherein the presence of said destructive event triggers one or more alarms to signify the presence of an anomaly wherein the severity of said anomaly determines which said alarm will be triggered.

3. The apparatus of claim 1 wherein each said detector is comprised ot an acoustic detector module which detects said analog signals along a transmission line, digitizes said signals, and transmits said signals via a data packet to said remote processing unit, and a gas product detector module which monitors for products of combustion by determining the purity of gaseous atmosphere inside said transmission line, acid vapors and/or monoxides and creates a linear quality word representing gas purity within said transmission line, said linear quality word is embedded into said data packet and transmitted to said remote processing unit.

4. The apparatus of claim 1 wherein said detectors are positioned approximately 200 feet apart along said transmission line.

5. The apparatus of claim 1 wherein said processor further includes display means for visually displaying one or more said audio signals.

6. The apparatus of claim 1 further comprising communication means for allowing a remote user to access said audio signals, and said database of permissible and non-permissible sounds, located at said processing unit.

7. The apparatus of claim 6 wherein said communication means is a modem.

8. The apparatus of claim 6 wherein said communication means is a modem and sound card.

9. The apparatus of claim 1 further including means for allowing a user to update the quantity of said permissible and non-permissible sounds by adding one or more of said audio signals to said database.

10. The apparatus of claim 1 wherein said detectors are tuned to monitor said acoustic signatures within an audio band of between 20 KHz to 40 KHz.

11. An apparatus for detecting and monitoring system anomalies along a transmission line comprising:
    a plurality of detectors situated approximately 200 feet apart along said transmission line tuned to monitor acoustic signatures of audio signals along said transmission line within an audio band of between 20 KHZ to 40 KHz, wherein each said detector is comprised of an acoustic detector module which detects said analog audio signals, digitizes said signals, and transmits said signals via a data packet to said remote processing unit, said digitized signals encoded with a number corresponding to the detector's location along said transmission line, and a gas product detector module for monitoring the pressurized environment within said transmission line and creates a linear quality word representing gas purity within said transmission line, said linear quality word is embedded into said data packet and transmitted to said remote processing unit, said linear quality word containing a number corresponding to the detector's location along said transmission line;
    a processing unit disposed at a location remote from said detectors, paid processor further includes display means for visually displaying one or more said audio signals;
    means for transmitting said audio signal to said processing unit;
    means for comparing said transmitted audio signals to a database of permissible and non-permissible sounds to determine if said audio signals qualify as a destructive event;
    one or more alarm triggering means wherein the presence of said destructive event triggers one or more alarms to signify the presence of an anomaly, the severity of said anomaly determines which said alarm will be triggered, said anomaly comprising either an acoustic anomaly or a chemical anomaly;
    communication means for allowing a remote user to access said audio signals, and said database of permissible and non-permissible sounds, located at said processing unit, said communication means being a modem; and
    means for allowing a user to update the quantity of said permissible and non-permissible sounds by adding one or more of said audio signals to said database.

12. A method for detecting and monitoring anomalies along a transmission line having a plurality of detectors situated along said transmission line, a processing unit disposed at a location remote from said detectors, means for transmitting said audio signal to said processing unit, and means for comparing said transmitted audio signals to a database of permissible sounds to determine if said audio signals qualify as a destructive event comprising the steps of:
    detecting acoustic signatures and gas purity along said transmission line;
    transmitting said acoustic signatures and said gas purity information to a processing unit disposed at a location remote from said detectors;
    comparing said detected acoustic signatures and said gas purity information to a database of predetermined acceptable and non-acceptable acoustic signatures and gas purity levels;

providing a visual output display of said acoustic signatures and said gas purity information;

providing means to trigger one or more alarms in the case of said destructive event, wherein said alarm to be triggered is dependent upon the result of said comparison of said acoustic signature and said gas purity information with said predetermined acceptable and non-acceptable acoustic signatures and gas purity levels; and wherein each said detector is comprised of an acoustic detector module which detects said analog signals, digitizes said signals, and transmits said signals via a data packet to said remote processing unit wherein said digitized signals are encoded with a number corresponding to the detector's location along said transmission line, and a gas product detector module for monitoring the pressurized environment within said transmission line which creates a linear quality word representing gas purity within said transmission line, said linear quality word is embedded into said data packet and transmitted to said remote processing unit, wherein said linear quality word representing gas purity within said transmission line contains a number corresponding to the detector's location along said transmission line.

13. The method for detecting and monitoring anomalies along a transmission line of claim 12 wherein said anomaly comprises either an acoustic anomaly or a chemical anomaly.

14. The method for detecting and monitoring anomalies along a transmission line of claim 12 wherein said detectors are positioned approximately 200 feet apart.

15. The apparatus of claim 12 wherein said remote processor further includes display means for visually displaying one or more said audio signals.

16. The apparatus of claim 12 further comprising communication means for allowing a remote user to access said audio signals, and said database of permissible and non-permissible sounds, located at said processing unit.

17. The apparatus of claim 16 wherein said communication means is a modem.

18. The apparatus of claim 12 further including means for allowing a user to update the quantity of said permissible and non-permissible sounds by adding one or more of said audio signals to said database.

19. The apparatus of claim 12 wherein said detectors are tuned to monitor said acoustic signatures within an audio band of between 20 KHz to 40 KHz.

* * * * *